(12) United States Patent
Ikeda

(10) Patent No.: US 6,285,768 B1
(45) Date of Patent: Sep. 4, 2001

(54) NOISE CANCELLING METHOD AND NOISE CANCELLING UNIT

(75) Inventor: Shigeji Ikeda, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/324,992

(22) Filed: Jun. 2, 1999

(30) Foreign Application Priority Data

Jun. 3, 1998 (JP) .................................................. 10-154144

(51) Int. Cl.[7] .................................................. H03B 29/00
(52) U.S. Cl. .................................... 381/71.11; 381/94.7
(58) Field of Search .............................. 381/71.1, 71.8, 381/71.11, 94.1, 94.7

(56) References Cited

U.S. PATENT DOCUMENTS

| 5,727,073 | * | 3/1998 | Ikeda | 381/94.7 |
| 5,953,380 | * | 9/1999 | Ikeda | 375/346 |
| 5,978,824 | * | 11/1999 | Ikeda | 708/322 |

FOREIGN PATENT DOCUMENTS 0751619   1/1997 (EP).

OTHER PUBLICATIONS

European Search Report (in English) issued Nov. 11, 1999 in related application.

* cited by examiner

Primary Examiner—Forester Isen
Assistant Examiner—Brian Tyrone Pendleton
(74) Attorney, Agent, or Firm—Ostrolenk, Faber, Gerb & Soffen, LLP

(57) ABSTRACT

A signal-to-noise power ratio estimation circuit 22 detects an error signal power of an error signal output from a subtracter 13 and a pseudo noise signal power of a pseudo signal output from an adaptive filter 12 and, based on the detected signal powers, outputs an estimated value SNR1 of a signal-to-noise power ratio. An SNR average circuit 20 calculates an average value SNR4 of the SNR1. A step size output circuit 21 controls the step size of the adaptive filter 12 according to the SNR4 value.

6 Claims, 3 Drawing Sheets

NOISE CANCELLING METHOD AND NOISE CANCELLING UNIT

BACKGROUND OF THE INVENTION

1. Field of the Invention

The present invention relates to a noise canceling method and a noise canceling unit, and more particularly to a noise canceling method and a noise canceling unit which use an adaptive filter to cancel background noises introduced into sound signals entered from a microphone or a handset.

2. Description of the Related Art

Background noise signals, introduced into sound signals entered from a microphone or a handset, create a serious problem in a highly-compressed narrow band audio coding unit or a speech recognition unit. As a noise canceling unit which cancels such acoustically-superimposed noise components, a two-input noise canceling unit using an adaptive filter is described in "Adaptive Noise Canceling: Principles and Applications" by B. Widrow et. al., Proceedings of IEEE, Vol. 63, No. 12, 1975, pp. 1692–1716 (hereinafter called Reference 1).

This two-input noise canceling unit uses an adaptive filter which closely approximates the impulse response of the noise path, from the reference input terminal to the speech input terminal, through which noise signals entered from the reference input terminal travel. This adaptive filter generates pseudo noise signals corresponding to the noise signal components mixed into the speech input terminal and then subtracts the pseudo noise signals from the signals received from the speech input terminal (combination of speech signals and noise signals), thus suppressing noise signals.

In this configuration, the coefficients of the adaptive filter are modified by the correlation between the error signal produced by subtracting the pseudo noise signal from the received signal (combination of speech signals and noise signals) and the reference signal entered from the reference input terminal. Some of the known adaptive filter coefficient modification methods, or convergence algorithms, include "LMS Algorithm" described in Reference 1 and "Learning Identification Method: LIM)" described in "IEEE Transactions on Automatic Control", Vol. 12, Number 3, 1967, pp. 282–287 (hereinafter called Reference 2).

FIG. 3 is a block diagram showing an example of a conventional noise canceling unit. A speech is picked up and converted to an electric signal, for example, by a microphone placed near the speaker. This speech signal, received at a speech input terminal 1, includes a background noise. On the other hand, the signal, picked up by a microphone located away from the speaker and then converted to an electric signal, corresponds to the background noise signal. This noise signal is received at a reference terminal 2.

The signal received at the speech input terminal 1 (hereinafter called the received signal) is composed of the speech signal and the background noise as described above. This signal is then supplied to a delay circuit 3. The delay circuit 3 adds the delay amount of Δ t1 (delay time) to the received signal which is then sent to a subtracter 5. The delay circuit 3, inserted to satisfy the law of causality, normally has a delay amount of approximately the half of the number of taps of an adaptive filter 4. On the other hand, the noise signal, entered into the reference terminal 2, is supplied to the adaptive filter 4 as the reference noise signal.

Upon receiving the reference noise signal, the adaptive filter 4 generates a pseudo noise signal through filtering and then supplies it to the subtracter 5.

The subtracter 5 subtracts the pseudo noise signal generated by the adaptive filter 4 from the received signal delayed by the delay circuit 3 to cancel the background noise signal included in the received signal. The subtracter 5 then outputs the received signal to an output terminal 6 and, at the same time, supplies it to the adaptive filter 4 as the error signal.

The adaptive filter 4 serially updates the filter coefficients based on the following three: reference noise signal supplied from the reference terminal 2, the error signal supplied from the subtracter 5, and the step size α set up for coefficient updating. The "LMS algorithm" described in Reference 1 and the "LIM" described in Reference 2 are used as the filter coefficient update algorithm.

Let the speech signal component of the received signal sent from the speech input terminal 1 be s(k) (where, k is an index representing time), let the noise signal component to be canceled be n(k), and let the delay amount Δt of the delay circuit 3 be zero. Then, the received signal y(k) supplied from the speech input terminal 1 to the subtracter 5 is represented by the following expression:

$$y(k)=s(k)+n(k) \qquad (1)$$

The adaptive filter 4 receives the reference noise signal x(k) from the reference terminal 2 and generates the pseudo noise signal r(k) corresponding to the noise signal component n(k) used in expression (1). The subtracter 5 subtracts the pseudo noise signal r(k) from the received signal y(k) to output the error signal e(k). Assuming that, as compared with the speech signal component s(k), the additive noise component is small enough to be ignored, the error signal is represented by the following expression:

$$e(k)=s(k)+n(k)-r(k) \qquad (2)$$

The following describes how the coefficients of the adaptive filter 4 are updated using the "LMS algorithm" described in Reference 1. Let the j-th coefficient of the adaptive filter 4 at time k be wj(k). Then, the pseudo noise signal r(k) output by the adaptive filter 4 is represented by expression (3), where N is the number of taps of the adaptive filter 4.

[Expression 1] \qquad (3)

$$r(k) = \sum_{j=0}^{N-1} w_j(k) \cdot x(k-j)$$

Applying the pseudo noise signal r(k), calculated by expression (3), to expression (2) gives the error signal e(k). With the use of the obtained error signal e(k), the filter coefficient wj(k+1) at time (k+1) is calculated by the following expression:

$$wj(k+1)=wj(k)+\alpha \cdot e(k) \cdot x(k-j) \qquad (4)$$

In expression (4), α, a constant called a step size, is a parameter determining the coefficient convergence time and the residual error amount after convergence.

On the other hand, LIM, the filter coefficient update method described in Reference 2, is calculated by expression (5).

[Expression 2]

$$w_j(k+1) = w_j(k) + \frac{\mu \cdot e(k) \cdot x(k-1)}{\sum_{m=k-N+1}^{k} (x(m))^2} \quad (5)$$

In expression (5), $\mu$ is the step size for LIM. LIM performs convergence more reliably than the LMS algorithm by making the step size inversely proportional to the average power of the reference noise signal x(k) entered into the adaptive filter.

When the step size value, that is, $\alpha$ for the LMS algorithm or $\mu$ for LIM, is large, the amount of coefficient modification becomes large and therefore the convergence becomes faster. However, the components interfering with coefficient updating, if present, have strong influence, increasing the residual error amount. Conversely, when the step size value is small, the convergence takes long with a smaller interfering signal component influence and a smaller residual error amount. This means that there is a tradeoff between the "convergence time" and the "residual error" in setting up the step size.

The object of the adaptive filter 4 of the noise canceling unit is to generate the pseudo signal component r(k) corresponding to the noise signal n(k). Thus, the difference between n(k) and r(k), that is, the residual error (n(k)−r(k)), is required for use as the error signal for adaptive filter coefficient updating. However, as shown in expression (2), the error signal e(k) includes the speech signal component s(k) and this speech signal component s(k), which acts as the interfering signal component, has strong influence on the coefficient update operation of the adaptive filter 4.

To reduce the influence of the speech signal component s(k) which acts as the interfering signal to the adaptive filter 4, it is necessary to set an extremely small step size value for the coefficient updating of the adaptive filter 4 used in the noise canceling unit. However, the problem is that a small step size value delays the convergence of the adaptive filter 4 as described above.

To solve this problem, the "noise canceling method and noise canceling unit (Japanese Patent Laid-Open Publication No. Hei 10-3298)" is proposed. The method disclosed in the publication uses a second adaptive filter to estimate the signal-to-noise power ratio of the received signal and, based on the estimated ratio value, controls the step size of the first adaptive filter to increase the conversion and to reduce the residual error.

FIG. 2 is a block diagram showing the conventional method described in Japanese Patent Laid-Open Publication No. Hei 10-3298. As shown in FIG. 2, the conventional method comprises a delay circuit 8, a delay circuit 9, a signal-to-noise power ratio estimation circuit 10, a delay circuit 17, a comparison circuit 18, and a step size output circuit 19 to control the step size of the adaptive filter 4.

The signal-to-noise power ratio estimation circuit 10 comprises a delay circuit 11 receiving the received signal y(k) from the speech input terminal 1, an adaptive filter 12 receiving the reference noise signal x(k) from the reference terminal 2, a subtracter 13 subtracting the pseudo noise signal rl(k) output by the adaptive filter 12 from the signal delayed by the delay circuit 11, power average circuits 14 and 15 averaging the powers of the signals output by the subtracter 13 and the adaptive filter 12, respectively, and a division circuit 16 dividing the signal output from the power average circuit 14 by the signal output from the power average circuit 15.

First, the operation of the signal-to-noise power ratio estimation circuit 10 is described. The adaptive filter 12 receives the reference noise signal x(k) from the reference terminal 2, receives the output error signal from the subtracter 13, and outputs the pseudo noise signal. The delay circuit 11, which delays the received signal y(k) for the delay amount of $\Delta$ t1, is inserted to compensate for the law of causality as with the delay circuit 3. The subtracter 13 subtracts the pseudo noise signal output by the adaptive filter 12 from the signal delayed by the delay circuit 11 and sends the subtraction result to the adaptive filter 12 as the reference signal.

To increase the convergence speed, a larger value is assigned to the step size for updating the coefficients of the adaptive filter 12. For example, when LIM described in Reference 2 is used as the coefficient update algorithm, a value ranging from 0.2 to 0.5 is used as the step size $\mu$.

Now, let the received signal be y(k), let the reference noise signal entered into the adaptive filter 12 be x(k), let the pseudo noise signal output from the adaptive filter 12 be $r_1(k)$, and let the delay amount $\Delta t_1$ of the delay circuit 11 be zero as in the conventional method. Then, the error signal $e_1(k)$ output from the subtracter 13 is represented by the following expression:

$$e_1(k)=y(k)-r_1(k) \quad (6)$$

Because the received signal y(k) is represented by the sum of the speech signal s(k) and the noise signal n(k) as in expression (1), expressions (6) and (7) are written as follows:

$$e_1(k)=s(k)+n(k)-r_1(k) \quad (7)$$

The error signal $e_1(k)$ output from the subtracter 13 is supplied to the adaptive filter 12 as the error signal for coefficient updating and, at the same time, to the power average circuit 14. The power average circuit 14 squares the error signal $e_1(k)$ and outputs the time average.

The square $e_1^2(k)$ of the error signal $e_1(k)$ is given by expression (8):

$$e_1^2(k)=\{s(k)+n(k)-r_1(k)\}^2 \quad (8)$$

The power average circuit 14 time-averages this square values $e_1^2(k)$ To approximate this value with an expected value, the expected value $E_1^2[(k)]$ is represented by the expression given below. This is because the speech signal s(k)and reference noise signal x(k) are independent of each other and, therefore, the speech signal s(k) and the noise signal n(k) are independent of each other:

$$E[e_1^2(k)]=E[s^2(k)]+E[\{n(k)-r_1(k)\}^2] \quad (9)$$

The second term of the right-hand side of expression (9) represents the residual error component. A larger step size, if used to speed up the convergence, rapidly attenuates this residual error component, resulting in the following expression:

[Expression 3]

$$E[e_1^2(k)]=E[s^2(k)] \quad (10)$$

Therefore, as shown in expression (10), the output from the power average circuit 14 approximates the speech signal power $s^2(k)$.

On the other hand, the power average circuit 15 squares the pseudo noise signal $r_1(k)$ output from the adaptive filter 12 and time-averages the result. A larger step size value, when set in the adaptive filter 12, increases the convergence speed. Therefore, the following expression is obtained:

[Expression 4]

$$r_1(k) \approx n(k) \tag{11}$$

Therefore, the expected value $E[r_1 2(k)]$ of the squared value $r_1 2(k)$ of the pseudo noise signal $r_1(k)$ may be approximated by expression (12):

[Expression 5]

$$E[r_1^2(k)] \approx E[n^2(k)] \tag{12}$$

Therefore, the signal output from the power average circuit 15 approximates the noise signal power $n^2(k)$. The division circuit 16 divides the signal output from the power average circuit 14 by the signal output from the power average circuit 15 and, as a result, outputs the estimated value SNR1 of the signal-to-noise power ratio.

If the operation of the power average circuits 14 and 15 is performed, for example, by calculating the moving averages, a delay $\Delta_{av}$ with respect to the actual power times the average is calculated. Thus, to compensate for this variations is generated. The delay depends on the number of delay of $\Delta_{AV}$ in this embodiment, the delay circuit 9 giving the delay of $\Delta t2$ to the input reference noise signal of the adaptive filter 4 is provided on the input side of the adaptive filter 4 and, at the same time, the delay circuit 8 giving the delay of $\Delta t2$ to the received signal is provided on the input side of the delay circuit 3. Note that the delay of $\Delta t2$ is normally set to a value equal to or larger than the delay amount of $\Delta_{AV}$. The value of $\Delta t2$, if set to a value larger than $\Delta_{AV}$, would cause a change in SNR1 to be detected earlier than the SNR value of the actual input received signal of the subtracter 5. This means an extension of SNR1 in the negative direction in terms of time. The delay circuit 8 and the delay circuit 3 may be configured as a single delay circuit giving the delay of ($\Delta t2+\Delta t1$).

As described above, the signal-to-noise power ratio estimation circuit 10 receives the received signal from the speech input terminal 1 as well as the reference noise signal from the reference terminal 2 to cause the adaptive filter 12 outputting the pseudo noise signal to operate. The signal-to-noise power ratio estimation circuit 10 detects the error signal power and the pseudo noise signal power from the pseudo noise signal sent from the adaptive filter 12 and, based on these powers, outputs the estimated value SNR1 of the signal-to-noise power ratio.

Next, the operation of the delay circuits 8, 9, and 17 and that of the comparison circuit 18 are described. The delay circuit 17 gives the delay of $\Delta t3$ to the estimated signal-to-noise power ratio value SNR1 output from the signal-to-noise power ratio estimation circuit 10. The comparison circuit 18 compares the estimated signal-to-noise power ratio value SNR1 entered into the delay circuit 17 with the estimated signal-to-noise power ratio value SNR2 delayed by the delay circuit 17 and outputs the larger of the two as the estimated value SNR3. The estimated signal-to-noise power ratio SNR3 is a value extended in the positive direction by $\Delta t3$ in terms of time.

Next, the operation of the step size output circuit 19 is described. The step size output circuit 19 receives the estimated value SNR3 of the extended signal-to-noise power ratio output from the comparison circuit 18 and outputs a value corresponding to the received value SNR3 to the adaptive filter 4 as its step size. At this time, when the SNR3 value is large, the step size output circuit 19 outputs a small step size; conversely, when the SNR3 value is small, the step size output circuit 19 outputs a large step size. More specifically, let the SNR3 value at time k be SNR3(k) and let the step size at time k be $\mu(k)$. Then, the relation between SNR3(k) and $\mu(k)$ is represented, for example, by expression (13) as follows:

$$\mu(k)=\text{clip}[A \cdot 1/\text{SNR3}(k), \mu\text{max}, \mu\text{min}] \tag{13}$$

where, A is a constant ranging in value from approximately 0.1 to 0.5. clip[a, b, c] is the relation defined as follows to set up the minimum and maximum.

[Expression 6]

$$\text{clip}[a, b, c]=a \ (c \leq a \leq b) \tag{14a}$$

$$\text{clip}[a, b, c]=b \ (a>b) \tag{14b}$$

$$\text{clip}[a, b, c]=c \ (a<c) \tag{14c}$$

Suppose that A=0.1, $\mu$max=0.5, and $\mu$min=0.01. Then, expression (13) is represented as expression (15) as follows:

$$\mu(k)=\text{clip}[0.1/\text{SNR3}(k), 0.5, 0.01] \tag{15}$$

Thus, when the SNR3 value is 0 dB, that is, when SNR3(k)=1, the step size is 0.1 from expression (14a) When the SNR3 value is 10 dB, that is, when SNR3(k)=10, the step size is 0.01 from expression (14a). However, when the SNR3 value is –10 dB, that is, when SNR3(k)=0.1, the step size is limited by the maximum and is set to 0.5 from expression (14b). Similarly, when the SNR3 value is 20 dB, that is, when SNR3(k)=100, the step size is limited by the minimum and is set to 0.01 from expression (14c). The limitation range of the step size like this is effective for the reliable operation of the adaptive filter.

As described above, the step size output circuit 19 controls the step size of the adaptive filter 4 according to the estimated signal-to-noise power ratio value SNR3. This estimated signal-to-noise power ratio value SNR3 is obtained by extending the estimated value SNR1, output from the signal-to-noise power ratio estimation circuit 10, through the delay circuit 17 and comparison circuit 18.

The conventional method described above controls the step size of the adaptive filter 4 with the use of estimated SNR3 value. This configuration increases the step size in a range where no speech signal is present or where the speech signal, if present, is extremely small as compared with the noise signal, thus speeding the convergence with no influence of the interfering signal. On the other hand, in a range where the speech signal component is large as compared with the noise signal, this configuration decreases the step size to prevent the residual error from increasing. At the same time, the SNR3 value used for step size control may be extended in the negative direction by the delay circuit 8 and the delay circuit 9, and in the positive direction by the delay circuit 17, in terms of time. This capability makes it possible to decrease the step size sufficiently before the speech signal starts and to increase the step size after the speech signal ends, allowing the coefficients of the adaptive filter 4 to be converged reliably.

In the noise canceling unit described above, the step size of the adaptive filter 12 is fixed. When "LIM" described in Reference 2 is used as the coefficient update algorithm, the step size $\mu$ is set to a fixed value ranging, for example, from 0.2 to 0.5. To speed up the convergence of the adaptive filter 12, the setting of the step size $\mu$ should be as large as possible. However, the setting, when too large, results in a large residual error, decreasing the estimated SNR precision and, as a result, increasing the distortion of the canceling unit. Because of this, a large setting cannot always be used. When the assumed SNR range is fixed in a range, a large step size may be used within the range in which the SNR precision is not decreased. However, when the assumed SNR range is large, the SNR value cannot be estimated precisely for a predetermined step size value which is fixed.

SUMMARY OF THE INVENTION

It is an object of the present invention to provide a noise canceling method and a noise canceling unit which perform SNR estimation correctly and speedily and which require less convergence time, and generate a smaller after-convergence distortion (residual error), than the conventional method.

To achieve the above object, the method according to claim is a noise canceling method for receiving a reference noise signal from a reference input terminal for input into a first adaptive filter and generating a pseudo noise signal through filtering according to filter coefficients, for subtracting, through a subtracter, the pseudo noise signal from a received-signal to generate an error signal, the received-signal being composed of a speech signal and a background signal entered from a speech input terminal, and for serially modifying the filter coefficients of the first adaptive filter in response to the error signal to output from the subtracter the received-signal from which noises are removed, the noise canceling method comprising the steps of receiving the reference signal and the received-signal; detecting an error signal power and a pseudo noise signal power from the pseudo noise signal generated by a second adaptive filter with a configuration similar to the configuration of the first adaptive filter; estimating a signal-to-noise power ratio of the received-signal from the error signal power and pseudo noise signal power; adaptively changing the filter coefficients of the second adaptive filter with a value corresponding to an average signal-to-noise power ratio calculated by averaging the signal-to-noise power ratios as a filter coefficient modification amount; comparing the estimated value of the signal-to-noise power ratio with the delayed estimated value produced by delaying the estimated value of the signal-to-noise power ratio for a predetermined time and outputting the larger as the estimated value of an extended signal-to-noise power ratio; and adaptively changing the filter coefficients with the value corresponding to the estimated value of the extended signal-to-noise power ratio as the modification amount of the filter coefficients of the first adaptive filter.

To achieve the above object, the noise canceling unit according to the present invention comprises a first delay circuit delaying a received-signal for a first time period, the received-signal being composed of a speech signal and a background noise signal entered from a speech input terminal; a second delay circuit delaying a reference noise signal entered from a reference input terminal for a second time period; a first adaptive filter receiving the delayed reference noise signal output from the second delay circuit and a first error signal and outputting a first pseudo noise signal through filtering according to filter coefficients; a first subtracter subtracting the first pseudo noise signal from the delayed received-signal output from the first delay circuit, supplying a resulting difference signal obtained from the subtraction to the first adaptive filter, and outputting to an output terminal the received-signal from which noises are removed; a signal-to-noise power ratio estimation circuit receiving the reference noise signal from the reference input terminal and the received-signal from the speech input terminal and producing an estimated value of a signal-to-noise power ratio of the received-signal; a third delay circuit delaying the estimated value output from the signal-to-noise power ratio circuit for a third time period; a comparison circuit comparing the estimated value entered into the third delay circuit with the delayed estimated value output therefrom and outputting the larger as the estimated value of the extended signal-to-noise power ratio; and a first step size output circuit outputting a first step size determining a modification amount of the filter coefficients of the first adaptive filter based on the estimated value of the extended signal-to-noise power ratio output from the comparison circuit.

The above-described signal-to-noise power ratio estimation circuit comprises a fourth delay circuit delaying the received-signal from the speech input terminal for a fourth time period; a second adaptive filter receiving the reference noise signal from the reference input terminal and a second error signal and outputting a second pseudo noise signal through the filtering according to the filter coefficients; a second subtracter subtracting the second pseudo noise signal from the delayed received-signal output from the fourth delay circuit and supplying the resulting difference signal obtained from the subtraction to the second adaptive filter as the second error signal; a first power average circuit receiving the difference signal from the second subtracter, calculating a square average value, and outputting the square average value as a received-signal power; a second power average circuit receiving the second pseudo noise signal from the second adaptive filter, calculating the square average value, and outputting the square average as a noise signal power; a division circuit dividing the received-signal power by the noise signal power and outputting the estimated value of the signal-to-noise power ratio of the received-signal; a signal-to-noise power ratio average circuit calculating the average of the signal-to-noise power ratio from the division circuit; a second step size output circuit outputting a second step size determining the modification amount of the filter coefficients of the second adaptive filter based on the average value from the signal-to-noise power ratio average circuit.

When a multiplied value produced by multiplying a reciprocal of the estimated value of the extended signal-to-noise power ratio output from the comparison circuit by predetermined coefficients is within a range between a predetermined first maximum value and a first minimum value, the first step size output circuit outputs the multiplied value as a first step size determining the modification amount of filter coefficients of the first adaptive filter, outputs the first maximum value as the first step size when the multiplied value is larger than the first maximum value, and outputs the first minimum value as the first step size when the multiplied value is smaller than the first minimum value.

When a multiplied value produced by multiplying the average of the signal-to-noise power ratio value output from the signal-to-noise power ratio average circuit by predetermined coefficients is within a range between a predetermined second maximum value and a second minimum value, the second step size output circuit outputs the multiplied value as a second step size determining the modification amount of the filter coefficients of the second adaptive filter, outputs the second maximum value as the second step size when the multiplied value is larger than the second maximum value, and outputs the second minimum value as the second step size when the multiplied value is smaller than the second minimum value.

The unit and the method according to the present invention control not only the step size value of the adaptive filter 4 but also that of the adaptive filter 12 used for estimating the signal-to-noise power ratio adaptively. More specifically, the unit and the method according to the present invention calculate the average of the estimated values of the signal-to-noise power ratios output from the division circuit 16 to determine the step size of the adaptive filter 12 in response to the average SNR value. Controlling the step size of the adaptive filter 12 in response to the value obtained through calculation of the average SNR of the received signal reduces the residual error of the adaptive filter, increasing the precision of SNR estimation.

DESCRIPTION OF THE PREFERRED EMBODIMENTS

Figure 1:
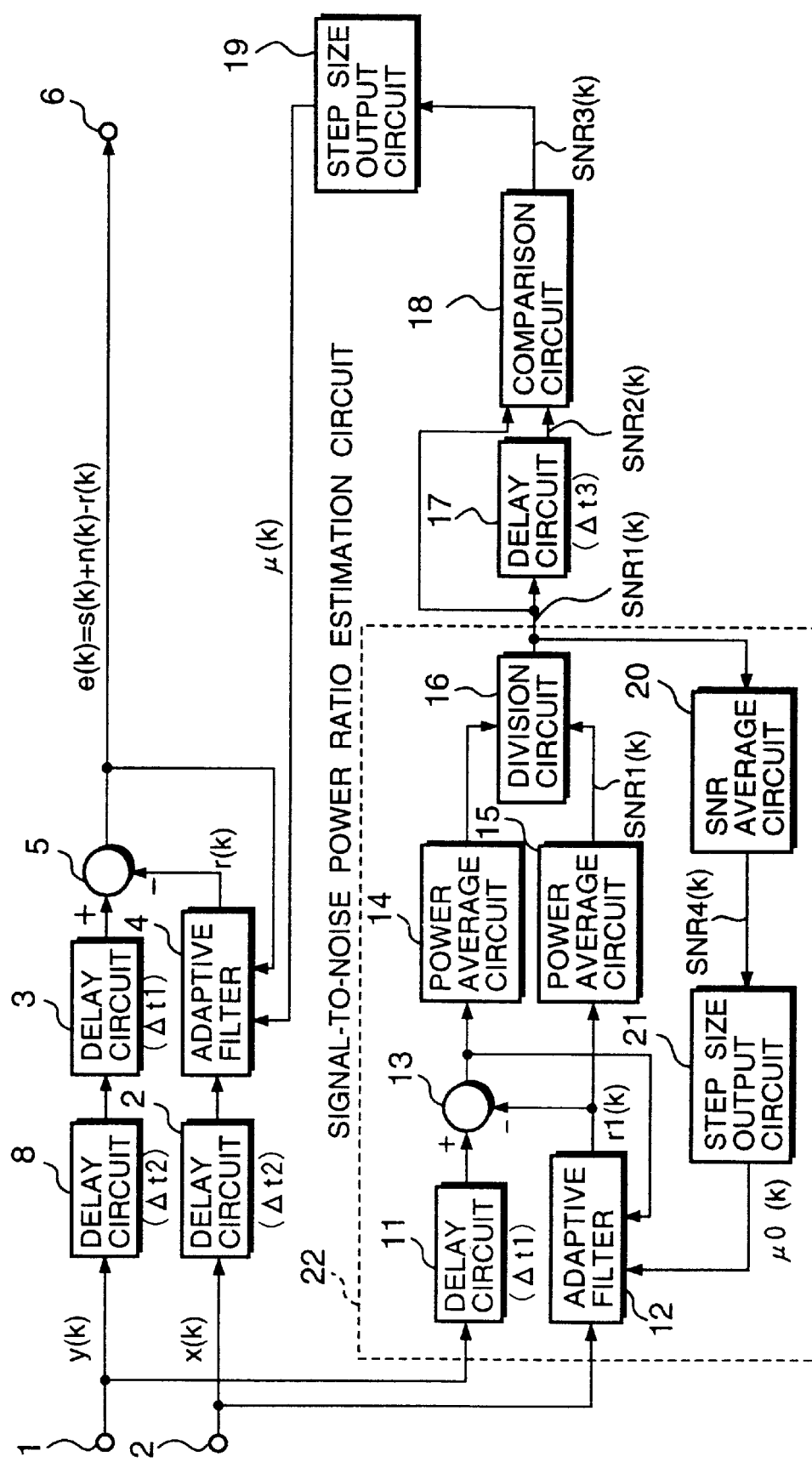
FIG. 1 is a block diagram showing an embodiment of the present invention.
Figure 2:
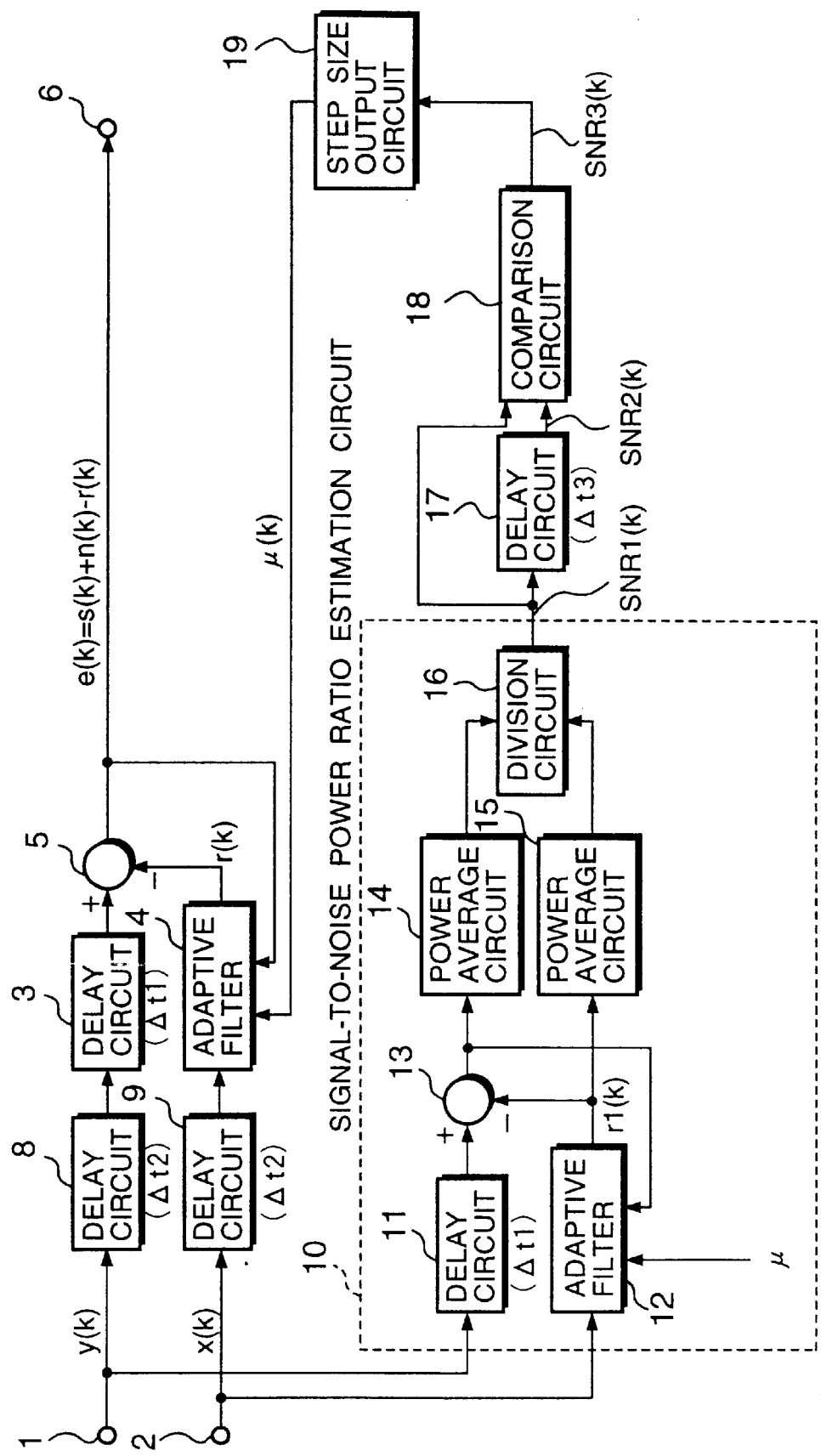
FIG. 2 is a block diagram showing an example of the conventional method.
Figure 3:
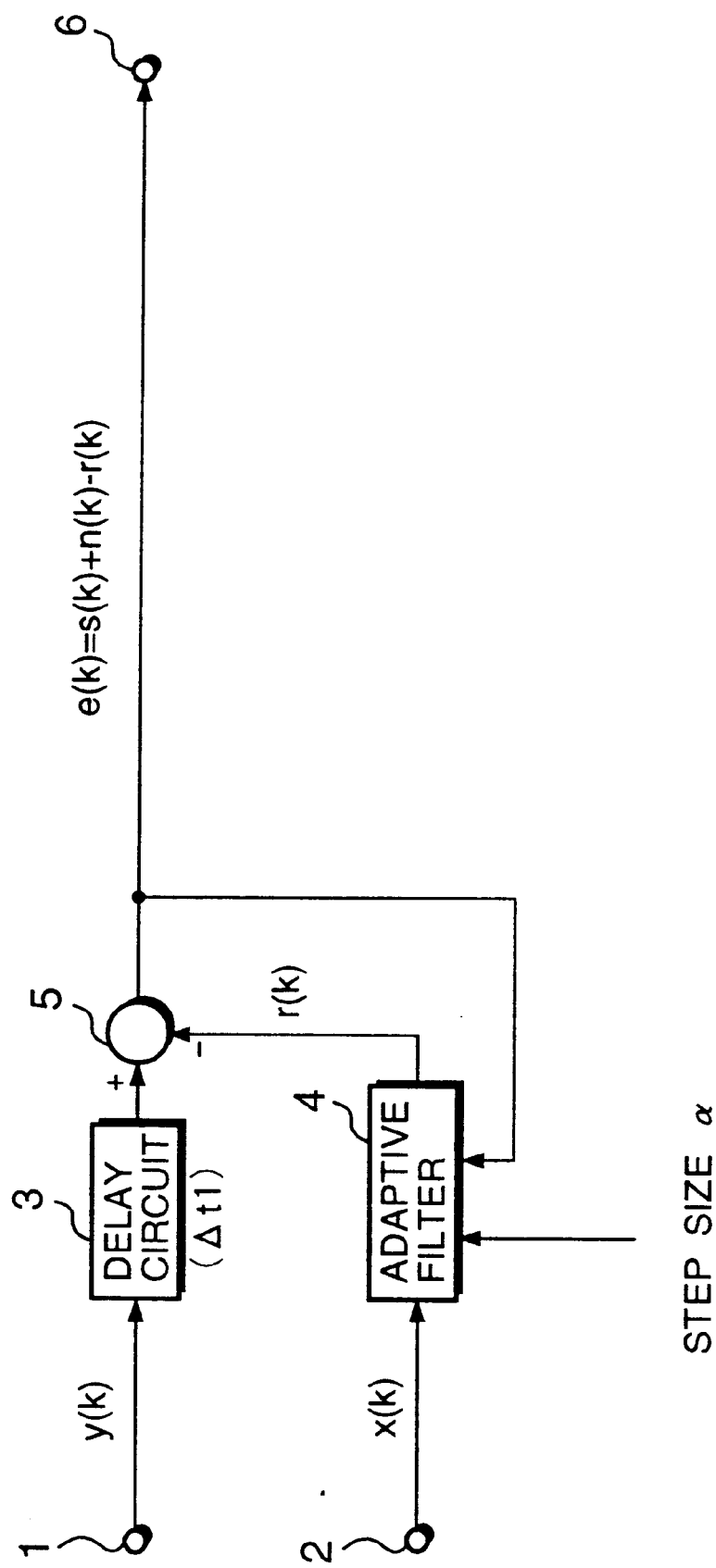
FIG. 3 is a block diagram showing an example of the conventional method.

The present invention will now be described in detail by referring to the attached drawings. FIG. 1 is a block diagram showing an embodiment of the present invention. In the figure, like numerals in FIG. 2 refer to like elements. As shown in FIG. 1, a signal-to-noise power ratio estimation circuit 22 comprises an SNR average circuit 20 and a step size output circuit 21 to control the step size of the adaptive filter 12. The conventional method and the method according to the present invention differ only in the signal-to-noise power ratio estimation circuits 10 and 22. Therefore, the following describes the operation of the signal-to-noise power ratio estimation circuit 22.

Unlike the conventional method, the step size of the adaptive filter 12 according to the present invention is controlled adaptively. The division circuit 16 divides the speech signal power output from the power average circuit 14 by the noise signal power output from the power average circuit 15 and outputs the resulting estimated value of the signal-to-noise power ratio value SNR1. Upon receiving the estimated value SNR1 from the division circuit 16, the SNR average circuit 20 calculates the average SNR4. In case the moving average calculation is performed 256 times, SNR4 at time k is expressed by expression (16) as follows:

[Expression 7]

$$SNR4(k) = \frac{1}{256}\sum_{j=0}^{255} SNR1(k-j) \qquad (16)$$

Next, the operation of the step size output circuit 21 is described. Upon receiving the SNR average value SNR4 from the SNR average circuit 20, the step size output circuit 21 outputs a step size, corresponding to the SNR4 value, as the step size of the adaptive filter 12. At this time, when the SNR4 value is large, the step size output circuit 21 outputs a small step size; conversely, when the SNR4 value is small, the step size output circuit 21 outputs a large step size. Let the SNR4 value at time k be SNR4(k) and let the step size at time k be $\mu_0(k)$. Then, the relation between SNR4(k) and $\mu_0(k)$ is represented, for example, by expression (17) as follows:

$$\mu_0(k)=\mathrm{clip}[A\cdot 1/SNR4(k)+B,\mu_0\mathrm{max},\mu_0\mathrm{min}] \qquad (17)$$

where, A and B are constants. clip[a, b, c] is the relation defined as follows to set up the minimum and maximum.

[Expression 8]

$$\mathrm{clip}[a, b, c]=a \quad (c\leq a \leq b) \qquad (18a)$$

$$\mathrm{clip}[a, b, c]=b \quad (a>b) \qquad (18b)$$

$$\mathrm{clip}[a, b, c]=c \quad (a<c) \qquad (18c)$$

Suppose that A=0.3, B=0.07, $\mu_0$max=0.5, and $\mu_0$min=0.1. Then, expression (17) is represented as follows:

$$\mu_0(k)=\mathrm{clip}[0.3/SNR4(k),0.07,0.5,0.1] \qquad (19)$$

Thus, when the SNR4 value is 0 dB, that is, when SNR4(k)=1, the step size is 0.37 from expression (18a). When the SNR4 value is 10 dB, that is, when SNR4(k)=10, the step size is 0.1 from expression (18a).

However, when the SNR4 value is −10 dB, that is, when SNR4(k)=0.1, the step size is limited by the maximum and is set to 0.1 from expression (18b). Similarly, when the SNR4 value is 20 dB, that is, when SNR4(k)=100, the step size is limited by the minimum and is set to 0.1 from expression (18c). The limitation range of the step size like this is effective for the reliable operation of the adaptive filter. In this way, the step size output circuit 21 controls the step size to be supplied to the adaptive filter 12 according to the average SNR value SNR4.

As described above, the noise canceling unit according to the present invention calculates the average SNR value and, based on the calculated SNR value, controls the step size to be supplied to the adaptive filter 12. This speedy and correct SNR estimation calculation allows the noise canceling unit according to the present invention to perform SNR estimation correctly and speedily, resulting in less convergence time and a smaller after-convergence distortion (residual error) than the conventional method even when the assumed SNR range is large.

As described above, the present invention controls the step size of the SNR estimation adaptive filter based on the average value of the signal-to-noise power ratio. This speedy and correct SNR estimation allows the noise canceling unit according to the present invention to perform SNR estimation correctly and speedily, resulting in less convergence time and a smaller after-convergence distortion (residual error) than the conventional method even when the assumed SNR range is large.

What is claimed is:

1. A noise canceling method for receiving a reference noise signal from a reference input terminal for input into a first adaptive filter and generating a pseudo noise signal through filtering according to filter coefficients, for subtracting, through a subtracter, the pseudo noise signal from a received-signal to generate an error signal, said received-signal being composed of a speech signal and a background signal entered from a speech input terminal, and for serially modifying the filter coefficients of said first adaptive filter in response to the error signal to output from said subtracter said received-signal from which noises are removed, said noise canceling method comprising the steps of:

receiving said reference signal and said received-signal;

detecting an error signal power and a pseudo noise signal power from the pseudo noise signal generated by a second adaptive filter with a configuration similar to the configuration of said first adaptive filter;

estimating a signal-to-noise power ratio of said received-signal from the error signal power and pseudo noise signal power;

adaptively changing the filter coefficients of said second adaptive filter with a value corresponding to an average signal-to-noise power ratio calculated by averaging the signal-to-noise power ratios as a filter coefficient modification amount;

comparing the estimated value of said signal-to-noise power ratio with the delayed estimated value produced by delaying the estimated value of said signal-to-noise power ratio for a predetermined time and outputting the larger as the estimated value of an extended signal-to-noise power ratio; and adaptively changing the filter coefficients with the value corresponding to the estimated value of the extended signal-to-noise power ratio as the modification amount of the filter coefficients of said first adaptive filter.

2. A noise canceling unit comprising:

a first delay circuit delaying a received-signal for a first time period, said received-signal being composed of a speech signal and a background noise signal entered from a speech input terminal;

a second delay circuit delaying a reference noise signal entered from a reference input terminal for a second time period;

a first adaptive filter receiving the delayed reference noise signal output from said second delay circuit and a first error signal and outputting a first pseudo noise signal through filtering according to filter coefficients;

a first subtracter subtracting said first pseudo noise signal from the delayed received-signal output from said first delay circuit, supplying a resulting difference signal obtained from the subtraction to said first adaptive filter, and outputting to an output terminal the received-signal from which noises are removed;

a signal-to-noise power ratio estimation circuit receiving the reference noise signal from said reference input terminal and the received-signal from said speech input terminal and producing an estimated value of a signal-to-noise power ratio of said received-signal;

a third delay circuit delaying the estimated value output from the signal-to-noise power ratio circuit for a third time period;

a comparison circuit comparing the estimated value entered into the third delay circuit with the delayed estimated value output therefrom and outputting the larger as the estimated value of the extended signal-to-noise power ratio; and a first step size output circuit outputting a first step size determining a modification amount of the filter coefficients of said first adaptive filter based on the estimated value of the extended signal-to-noise power ratio output from the comparison circuit;

wherein said signal-to-noise power ratio estimation circuit comprises:

a fourth delay circuit delaying the received-signal from said speech input terminal for a fourth time period;

a second adaptive filter receiving the reference noise signal from said reference input terminal and a second error signal and outputting a second pseudo noise signal through the filtering according to the filter coefficients;

a second subtracter subtracting said second pseudo noise signal from the delayed received-signal output from said fourth delay circuit and supplying the resulting difference signal obtained from the subtraction to said second adaptive filter as said second error signal;

a first power average circuit receiving the difference signal from said second subtracter, calculating a square average value, and outputting the square average value as a received-signal power;

a second power average circuit receiving the second pseudo noise signal from said second adaptive filter, calculating the square average value, and outputting the square average as a noise signal power;

a division circuit dividing said received-signal power by said noise signal power and outputting the estimated value of the signal-to-noise power ratio of said received-signal;

a signal-to-noise power ratio average circuit calculating the average of said signal-to-noise power ratio from the division circuit; and a second step size output circuit outputting a second step size determining the modification amount of the filter coefficients of said second adaptive filter based on the average value from said signal-to-noise power ratio average circuit.

3. The noise canceling unit according to claim 2, wherein, when a multiplied value produced by multiplying a reciprocal of the estimated value of the extended signal-to-noise power ratio output from said comparison circuit by predetermined coefficients is within a range between a predetermined first maximum value and a first minimum value, said first step size output circuit outputs the multiplied value as a first step size determining the modification amount of filter coefficients of said first adaptive filter, outputs the first maximum value as said first step size when the multiplied value is larger than the first maximum value, and outputs said first minimum value as said first step size when the multiplied value is smaller than the first minimum value.

4. The noise canceling unit according to claim 2, wherein, when a multiplied value produced by multiplying the average of the signal-to-noise power ratio value output from said signal-to-noise power ratio average circuit by predetermined coefficients is within a range between a predetermined second maximum value and a second minimum value, said second step size output circuit outputs the multiplied value as a second step size determining the modification amount of the filter coefficients of said second adaptive filter, outputs the second maximum value as said second step size when the multiplied value is larger than the second maximum value, and outputs said second minimum value as said second step size when the multiplied value is smaller than the second minimum value.

5. The noise canceling unit according to claim 2, wherein said second delay time is set to a time equal to or larger than a time required calculating the estimated value of the signal-to-noise power ratio of said received-signal in said signal-to-noise power ratio estimation circuit and wherein said first delay time is set to the time larger than said second delay time.

6. The noise canceling unit according to claim 2, wherein said fourth delay time is set to a time calculated by subtracting said second delay time from said first delay time.

* * * * *